(12) United States Patent
Lin et al.

(10) Patent No.: US 12,334,425 B2
(45) Date of Patent: Jun. 17, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Ho-Chuan Lin, Taichung (TW); Chia-Chu Lai, Taichung (TW); Min-Han Chuang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 450 days.

(21) Appl. No.: 18/056,078

(22) Filed: Nov. 16, 2022

(65) Prior Publication Data
US 2024/0079301 A1    Mar. 7, 2024

(30) Foreign Application Priority Data
Sep. 2, 2022   (TW) ................................. 111133425

(51) Int. Cl.
| | | |
|---|---|---|
| H01L 21/00 | (2006.01) | |
| H01L 21/56 | (2006.01) | |
| H01L 23/00 | (2006.01) | |
| H01L 23/31 | (2006.01) | |
| H01L 23/48 | (2006.01) | |
| H01L 23/498 | (2006.01) | |

(52) U.S. Cl.
CPC ........ *H01L 23/49822* (2013.01); *H01L 21/56* (2013.01); *H01L 23/3157* (2013.01); *H01L 24/16* (2013.01); *H01L 24/32* (2013.01); *H01L 24/73* (2013.01); *H01L 24/92* (2013.01); *H01L 2224/16225* (2013.01); *H01L 2224/32225* (2013.01); *H01L 2224/73204* (2013.01); *H01L 2224/9211* (2013.01)

(58) Field of Classification Search
None
See application file for complete search history.

(56) References Cited

U.S. PATENT DOCUMENTS

| | | | |
|---|---|---|---|
| 2005/0202691 A1* | 9/2005 | Tai ................... | H01L 23/49827 257/E23.068 |
| 2013/0156949 A1* | 6/2013 | Lin ..................... | B01D 69/108 427/247 |
| 2018/0150155 A1* | 5/2018 | Nishikawa ............ | G06F 3/0445 |

* cited by examiner

*Primary Examiner* — Nicholas J Tobergte
(74) *Attorney, Agent, or Firm* — Studebaker Brackett PLLC

(57) ABSTRACT

An electronic package is provided, in which a mesh structure is disposed between a circuit structure and an electronic element to increase the shunt path of current. Therefore, when the electronic element is used as an electrode pad of a power contact, the current can be passed through a conductive sheet of the circuit structure via the mesh structure, such that the power loss can be reduced and the IR drop of the electronic element can meet the requirements.

20 Claims, 6 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package for improving reliability and a manufacturing method thereof.

2. Description of Related Art

With the vigorous development of the electronic industry, electronic products are also gradually moving towards the trend of multi-function and high performance. In order to meet the packaging requirements of miniaturization of electronic packages, the technology of embedded packaging has been developed.

FIG. 1 is a schematic cross-sectional view of a conventional semiconductor package 1. As shown in FIG. 1, a semiconductor element 12 is embedded in an encapsulation layer 13. Next, a circuit structure 14 is formed on the encapsulation layer 13 and an active surface 12a of the semiconductor element 12, so that the circuit structure 14 is electrically connected to electrode pads 120 of the semiconductor element 12. After that, an insulating protection layer 15 is formed on the circuit structure 14, and parts of the surface of the circuit structure 14 are exposed from the insulating protection layer 15 for bonding conductive elements 16 such as solder balls.

However, in the conventional semiconductor package 1, the circuit of the circuit structure 14 is made of copper. Therefore, when the circuit structure 14 is designed to be thin and the thickness of the circuit is extremely thin, after the electrode pads 120 of the semiconductor element 12 are connected to the circuit of the circuit structure 14, the electrode pad 120 serving as a power source will suffer a great loss, so that its IR drop (e.g., voltage drop) does not meet the requirements.

Therefore, how to overcome the above-mentioned drawbacks of the prior art has become an urgent issue to be solved at present.

SUMMARY

In view of the various deficiencies of the prior art, the present disclosure provides an electronic package, comprising: a circuit structure defined with a first side and a second side opposing the first side, wherein the circuit structure is provided with a conductive sheet and a circuit layer spaced apart from the conductive sheet on the first side of the circuit structure; an electronic element disposed on the first side of the circuit structure, wherein the electronic element has a plurality of electrode pads, and at least one of the plurality of electrode pads is electrically connected to the circuit layer; and a mesh structure disposed between the electronic element and the first side of the circuit structure, wherein the mesh structure is electrically connected to the conductive sheet and at least the other one of the plurality of electrode pads, wherein the mesh structure has a plurality of interlaced strips to form a plurality of mesh holes corresponding to the plurality of electrode pads.

The present disclosure also provides a method of manufacturing an electronic package, the method comprising: providing a circuit structure, wherein the circuit structure is defined with a first side and a second side opposing the first side, and the circuit structure is provided with a conductive sheet and a circuit layer spaced apart from the conductive sheet on the first side of the circuit structure; disposing an electronic element having a plurality of electrode pads on the first side of the circuit structure, wherein at least one of the plurality of electrode pads is electrically connected to the circuit layer; and disposing a mesh structure between the electronic element and the first side of the circuit structure, wherein the mesh structure is electrically connected to the conductive sheet and at least the other one of the plurality of electrode pads, wherein the mesh structure has a plurality of interlaced strips to form a plurality of mesh holes corresponding to the plurality of electrode pads.

In the aforementioned electronic package and method, at least one of the plurality of electrode pads is used as a signal contact, and at least the other one of the plurality of electrode pads is used as a power contact.

In the aforementioned electronic package and method, the present disclosure further comprises forming a plurality of conductive bumps on the plurality of electrode pads, wherein a part of the plurality of conductive bumps is electrically connected to the circuit layer, and another part of the plurality of conductive bumps is electrically connected to the conductive sheet. The present disclosure also comprises providing the mesh structure and a protective layer on the electronic element, wherein the protective layer covers the mesh structure, the plurality of electrode pads and the plurality of conductive bumps. For example, the mesh structure and each of the plurality of conductive bumps are coplanar. Alternatively, a width of each of the strips is greater than a maximum diameter of an end surface of each of the plurality of conductive bumps.

In the aforementioned electronic package and method, a width of each of the strips is at least 10 micrometers.

In the aforementioned electronic package and method, the mesh structure is a metal mesh.

In the aforementioned electronic package and method, the present disclosure further comprises disposing the mesh structure on the electronic element; covering the electronic element and the mesh structure by an encapsulation layer, wherein the electronic element is embedded in the encapsulation layer; and forming the circuit structure on the encapsulation layer.

In the aforementioned electronic package and method, the present disclosure further comprises disposing the mesh structure on the circuit structure; disposing the electronic element on the circuit structure and the mesh structure in a flip-chip manner; and forming an encapsulation layer between the electronic element and the circuit structure, wherein the encapsulation layer covers the mesh structure.

As can be seen from the above, in the electronic package and the manufacturing method thereof of the present disclosure, the mesh structure is disposed between the electronic element and the circuit structure, so as to increase the shunt path of current. Therefore, compared with the prior art, in the electronic package of the present disclosure, the current at the electrode pads serving as power contacts can be passed through the conductive sheet to the second side of the circuit structure via a conductive area composed of the mesh structure and the conductive bumps, such that the power loss can be reduced, so that the IR drop of the electronic element can meet the requirements.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "upper," "first," "second," "one," "a," and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2D are schematic cross-sectional views illustrating a method of manufacturing an electronic package 2 according to a first embodiment of the present disclosure. In an embodiment, the electronic package 2 adopts the wafer level packaging specification.

Figure 1:
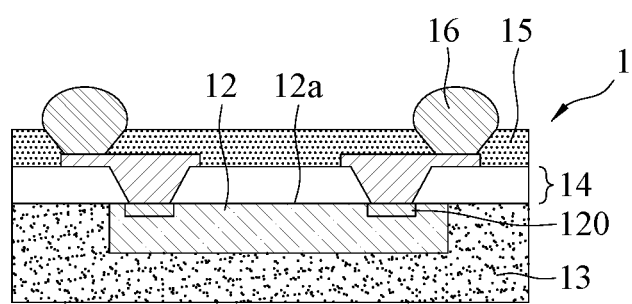
FIG. 1 is a schematic cross-sectional view of a conventional semiconductor package.
Figure 2A:
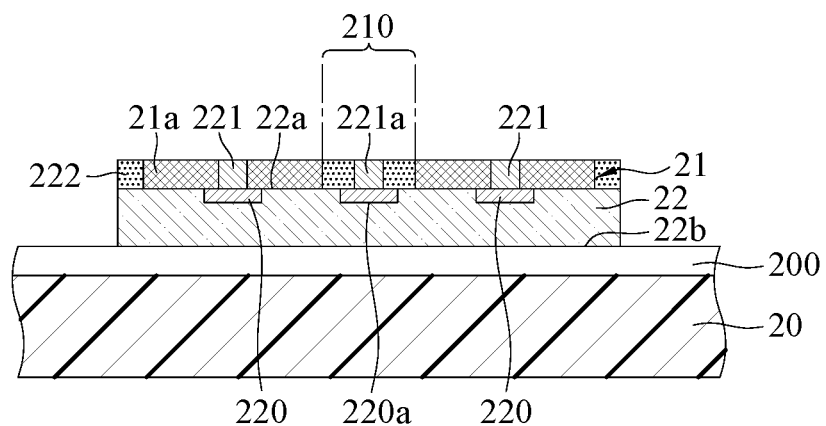
FIG. 2A to FIG. 2D are schematic cross-sectional views illustrating a method of manufacturing an electronic package according to a first embodiment of the present disclosure.

As shown in FIG. 2A, a carrier 20 having a release layer 200 is provided, and an electronic element 22 having a mesh structure 21 is disposed on the release layer 200.

In an embodiment, the carrier 20 is, for example, a plate of semiconductor material (e.g., silicon or glass), on which the release layer 200 is formed.

Furthermore, the electronic element 22 is an active element, a passive element, or a combination of the active element and the passive element, where the active element is, for example, a semiconductor chip, and the passive element is, for example, a resistor, a capacitor, or an inductor. For example, the electronic element 22 is an active element and has an active surface 22a and an inactive surface 22b opposing the active surface 22a, and the electronic element 22 is disposed on the release layer 200 with the inactive surface 22b thereof, wherein the active surface 22a has a plurality of electrode pads 220, 220a for conductive bumps 221, 221a such as copper pillars or solder balls to be formed on the electrode pads 220, 220a, and the mesh structure 21 and a protective layer 222 are formed on the active surface 22a, so that the protective layer 222 covers the mesh structure 21, the electrode pads 220, 220a and the conductive bumps 221, 221a, wherein some of the electrode pads 220 are used as power contacts, and some of the electrode pads 220a are used as signal contacts.

Further, the conductive bumps 221, 221a and the mesh structure 21 may be exposed from the protective layer 222. For example, the protective layer 222 is a non-conductive film (NCF), and a part of the protective layer 222 can be removed by a leveling process, such as etching or grinding, so that end surfaces of the conductive bumps 221, 221a and an upper surface of the mesh structure 21 are flush with an upper surface of the protective layer 222.

Figure 4:
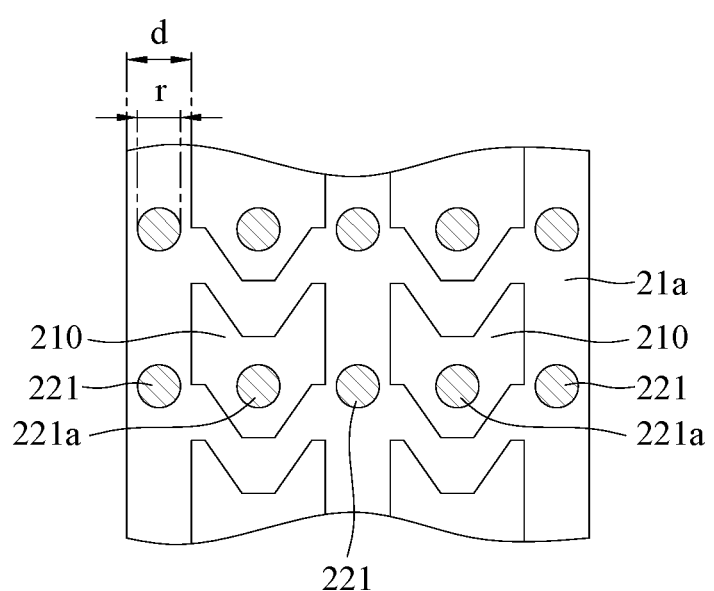
FIG. 4 is a schematic partial top view of the electronic package according to the present disclosure.

In addition, the mesh structure 21 is a metal mesh, which has a plurality of interlaced strips 21a to form mesh holes 210 (e.g., curved grooves as shown in FIG. 4) corresponding to the electrode pads 220a, so that the conductive bumps 221a connected to the signal contacts (the electrode pads 220a) are located in the mesh holes 210, and the conductive bumps 221 connected to the power contacts (the electrode pads 220) are connected to the strips 21a of the mesh structure 21 (as shown in FIG. 4), such that the protective layer 222 fills the remaining space of the mesh holes 210. For example, the mesh structure 21 and the conductive bumps 221, 221a can be simultaneously fabricated via an electroplating process, so that the mesh structure 21 and the conductive bumps 221, 221a have the same height, that is, they are coplanar. However, in other embodiments, the conductive bumps 221, 221a can also be higher than the mesh structure 21, so that the conductive bumps 221, 221a protrude from the mesh structure 21.

In addition, a width d of each of the strips 21a of the mesh structure 21 is greater than a maximum diameter r of the end surface of each of the conductive bumps 221, 221a, as shown in FIG. 4. For example, the width d of each of the strips 21a of the mesh structure 21 is at least 10 micrometers (μm).

Figure 2B:
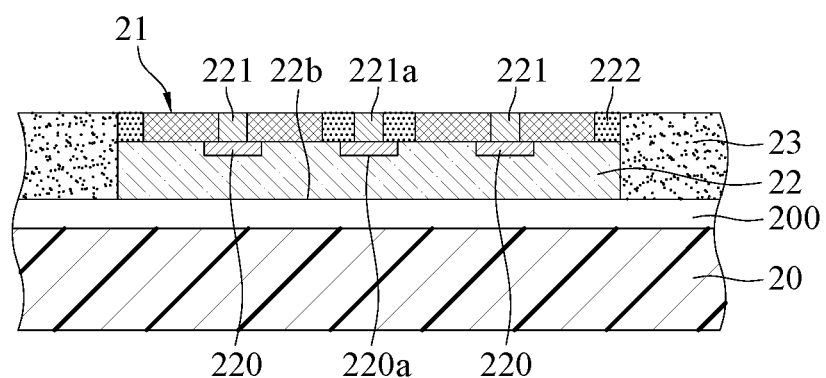

As shown in FIG. 2B, an encapsulation layer 23 is formed on the carrier 20, so that the encapsulation layer 23 covers the electronic element 22 and the protective layer 222.

In an embodiment, the material for forming the encapsulation layer 23 is an insulating material, such as polyimide (PI), dry film, encapsulation colloid such as epoxy resin, or a molding compound, and the encapsulation layer 23 can be formed on the carrier 20 by lamination or molding.

Furthermore, a leveling process, such as grinding, can remove a part of the encapsulation layer 23, and even remove a part of the protective layer 222 and/or a part of the conductive bumps 221, 221a, so that an upper surface of the encapsulation layer 23 is flush with the upper surface of the protective layer 222, such that the conductive bumps 221, 221a on the electronic element 22 are exposed from the encapsulation layer 23.

Figure 2C:
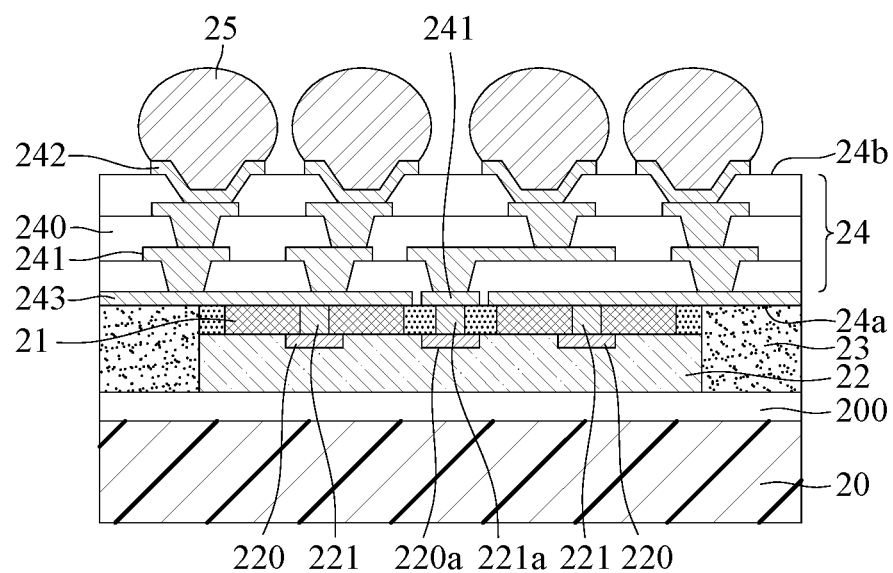

As shown in FIG. 2C, a redistribution layer (RDL) process is performed to form a circuit structure 24 on the encapsulation layer 23 and the electronic element 22, and the circuit structure 24 is electrically connected to the electronic element 22 and the mesh structure 21.

In an embodiment, the circuit structure 24 includes at least one dielectric layer 240, and a circuit layer 241 disposed on the dielectric layer 240 and electrically connected to the conductive bumps 221a, wherein the outermost circuit layer 241 has electrical contact pads 242 for bonding conductive elements 25 such as solder material. For example, the material for forming the circuit layer 241 is copper, and the material for forming the dielectric layer 240 is, for example, Ajinomoto build-up film (ABF), polybenzoxazole (PBO), polyimide (PI), prepreg (PP), or other dielectric materials, or a solder-proof material such as solder resist and graphite.

Furthermore, the circuit structure 24 is defined with a first side 24a and a second side 24b opposing the first side 24a, and the circuit structure 24 is bonded onto the encapsulation layer 23 with the first side 24a thereof, so that the conductive elements 25 are disposed on the electrical contact pads 242 of the second side 24b. For example, the circuit structure 24 has a conductive sheet 243 contacting the conductive bumps 221 and the mesh structure 21 on the first side 24a thereof, and the conductive sheet 243 is spaced apart from the circuit layer 241 of the first side 24a, so that the conductive sheet 243 is electrically connected to the mesh structure 21 and the conductive bumps 221 on the electrode pads 220 serving as power contacts, and the circuit layer 241 of the first side 24a is electrically connected to the conductive bumps 221a on the electrode pads 220a serving as signal contacts.

Figure 2D:
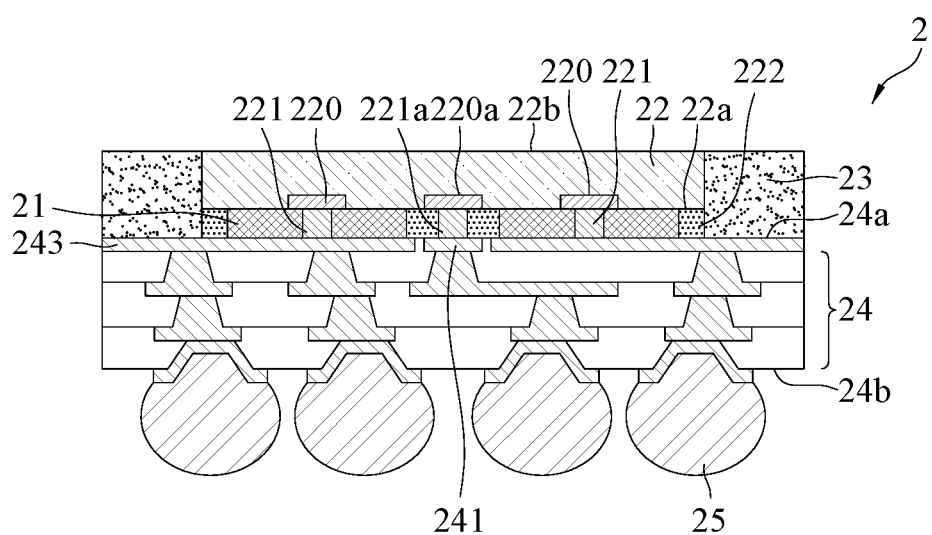

As shown in FIG. 2D, the carrier 20 and the release layer 200 are removed to expose the encapsulation layer 23 and the inactive surface 22b of the electronic element 22 to obtain the electronic package 2 of the present disclosure.

In an embodiment, the exposed surface of the encapsulation layer 23 is flush with the inactive surface 22b of the electronic element 22, so that the inactive surface 22b of the electronic element 22 is exposed from the encapsulation layer 23 for the electronic element 22 to dissipate heat.

Furthermore, the electronic package 2 can be connected to at least one electronic device such as a package module, a circuit board, a chip, or other electronic devices via the conductive elements 25.

Therefore, in the manufacturing method of the present disclosure, the mesh structure 21 is designed to increase the shunt path of the current. Therefore, compared with the prior art, even though the circuit structure 24 is designed to be thin and the thicknesses of the circuit layer 241 and the conductive sheet 243 are extremely thin, after the electronic element 22 is bonded to the circuit structure 24, the current at the electrode pads 220 serving as power contacts can be passed through the conductive sheet 243 to the conductive elements 25 of the second side 24b via a conductive area composed of the mesh structure 21 and the conductive bumps 221, such that the power loss can be reduced, so that the IR drop (e.g., voltage drop) of the electronic element 21 can meet the requirements.

Furthermore, the larger the layout area of the mesh structure 21 (or the thicker the width d of the strip 21a), the better the effect of reducing power loss. For example, when the width d of the strip 21a is greater than or equal to 10 micrometers (μm), the IR drop of the electronic element 21 can be reduced from 19.41 (without the mesh structure 21) to 14.09, which is about 25% lower.

Figure 3A:
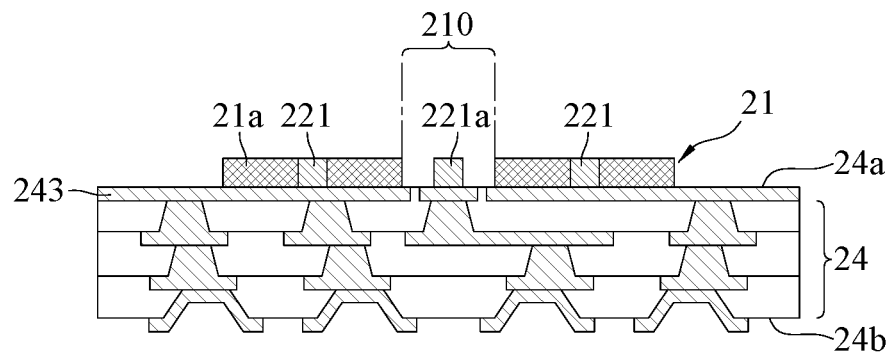
FIG. 3A to FIG. 3B are schematic cross-sectional views illustrating a method of manufacturing an electronic package according to a second embodiment of the present disclosure.
Figure 3B:
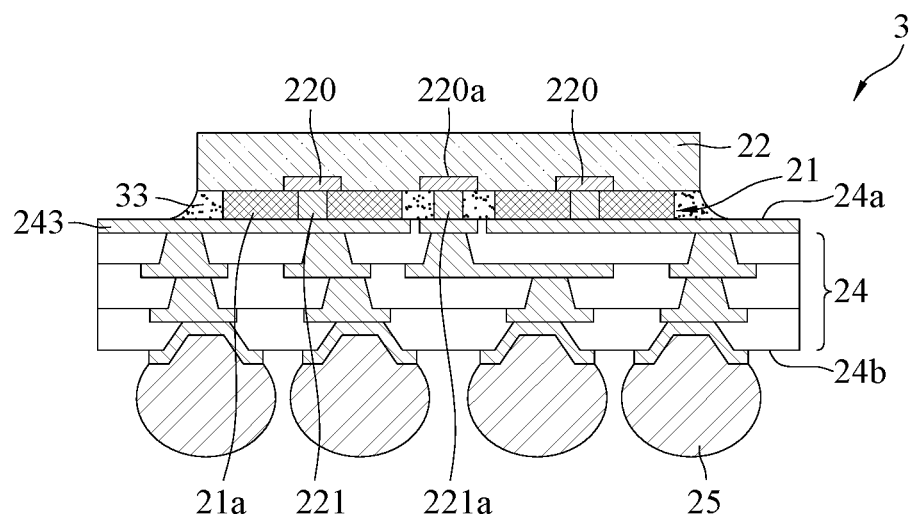

FIG. 3A to FIG. 3B are schematic cross-sectional views illustrating a method of manufacturing an electronic package 3 according to a second embodiment of the present disclosure. The difference between the second embodiment and the first embodiment lies in the packaging form, and other designs are substantially the same, so the similarities will not be repeated below. In an embodiment, the electronic package 3 adopts the flip-chip package specification.

As shown in FIG. 3A, the mesh structure 21 and the plurality of conductive bumps 221, 221a are formed on the first side 24a of the circuit structure 24.

In an embodiment, the circuit structure 24 is in the form of a carrier board, such as a package substrate with a core layer or a coreless package substrate. However, there are various types of the circuit structure 24, as long as it is a carrier board, such as a silicon interposer, for carrying electronic elements such as chips, and the present disclosure is not limited to as such.

Furthermore, the mesh structure 21 and the conductive bumps 221, 221a can be simultaneously fabricated on the surface of the first side 24a of the circuit structure 24 by an electroplating process, and the first side 24a of the circuit structure 24 is provided with the conductive sheet 243.

As shown in FIG. 3B, the electronic element 22 is bonded onto the conductive bumps 221, 221a with the electrode pads 220, 220a thereof in a flip-chip manner, so that the mesh structure 21 is located between the electronic element 22 and the first side 24a of the circuit structure 24. Afterwards, an encapsulation layer 33 such as an underfill is formed between the electronic element 22 and the first side 24a of the circuit structure 24, so that the encapsulation layer 33 covers the mesh structure 21 and the conductive bumps 221, 221a.

In an embodiment, the conductive elements 25 may be disposed on the second side 24b of the circuit structure 24.

Therefore, in the manufacturing method of the present disclosure, the mesh structure 21 is designed to increase the shunt path of the current. Therefore, compared with the prior art, after the electronic element 22 is bonded to the circuit structure 24, the current at the electrode pads 220 serving as power contacts can be passed through the conductive sheet 243 to the conductive elements 25 of the second side 24b via a conductive area composed of the mesh structure 21 and the conductive bumps 221, such that the power loss can be reduced, so that the IR drop of the electronic element 22 can meet the requirements.

The present disclosure further provides an electronic package 2, 3, which comprises: a circuit structure 24, at least one electronic element 22, and a mesh structure 21.

The circuit structure 24 is defined with a first side 24a and a second side 24b opposing the first side 24a, wherein the circuit structure 24 is provided with a conductive sheet 243 and a circuit layer 241 spaced apart from the conductive sheet 243 on the first side 24a of the circuit structure 24.

The electronic element 22 is disposed on the first side 24a of the circuit structure 24, wherein the electronic element 22 has a plurality of electrode pads 220, 220a, and at least one of the plurality of electrode pads 220a is electrically connected to the circuit layer 241.

The mesh structure 21 is disposed between the electronic element 22 and the first side 24a of the circuit structure 24 to electrically connect the conductive sheet 243 and at least the other one of the plurality of electrode pads 220, wherein the mesh structure 21 has a plurality of interlaced strips 21a to form mesh holes 210 at corresponding portions of the electrode pads 220a.

In one embodiment, at least one of the plurality of electrode pads 220a is used as a signal contact, and at least another one of the plurality of electrode pads 220 is used as a power contact.

In one embodiment, conductive bumps 221, 221a are formed on the plurality of electrode pads 220, 220a, so that a part of the conductive bumps 221a is electrically connected to the circuit layer 241, and another part of the conductive bumps 221 is electrically connected to the conductive sheet 243. Further, the mesh structure 21 and a protective layer 222 are formed on the electronic element 22, so that the protective layer 222 covers the mesh structure 21, the plurality of electrode pads 220, 220a and the plurality of conductive bumps 221, 221a. For example, the mesh structure 21 is coplanar with the conductive bumps 221, 221a. Alternatively, a width d of each of the strips 21a is greater than a maximum diameter r of an end surface of each of the conductive bumps 221, 221a.

In one embodiment, the width d of each of the strips 21a is at least 10 micrometers.

In one embodiment, the mesh structure 21 is a metal mesh.

In one embodiment, the electronic package 2 further includes an encapsulation layer 23 bonded to the circuit structure 24, such that the electronic element 22 is embedded in the encapsulation layer 23.

In one embodiment, the electronic package 2 further includes an encapsulation layer 33 formed between the electronic element 22 and the circuit structure 24 to cover the mesh structure 21.

To sum up, in the electronic package and the manufacturing method thereof of the present disclosure, the mesh structure is designed to increase the shunt path of the current. Therefore, in the electronic package of the present disclosure, the current of the electrode pads serving as power contacts can be passed through the conductive sheet to the second side of the circuit structure via the mesh structure and the conductive bumps, such that the power loss can be reduced, so that the IR drop of the electronic element can meet the requirements.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a circuit structure defined with a first side and a second side opposing the first side, wherein the circuit structure is provided with a conductive sheet and a circuit layer spaced apart from the conductive sheet on the first side of the circuit structure;
   an electronic element disposed on the first side of the circuit structure, wherein the electronic element has a plurality of electrode pads, and at least one of the plurality of electrode pads is electrically connected to the circuit layer; and
   a mesh structure disposed between the electronic element and the first side of the circuit structure, wherein the mesh structure is electrically connected to the conductive sheet and at least the other one of the plurality of electrode pads, wherein the mesh structure has a plurality of interlaced strips to form a plurality of mesh holes corresponding to the plurality of electrode pads.

2. The electronic package of claim 1, wherein at least one of the plurality of electrode pads is used as a signal contact, and at least the other one of the plurality of electrode pads is used as a power contact.

3. The electronic package of claim 1, further comprising a plurality of conductive bumps formed on the plurality of electrode pads, wherein a part of the plurality of conductive bumps is electrically connected to the circuit layer, and another part of the plurality of conductive bumps is electrically connected to the conductive sheet.

4. The electronic package of claim 3, wherein the electronic element is provided with the mesh structure and a protective layer thereon, and wherein the protective layer covers the mesh structure, the plurality of electrode pads and the plurality of conductive bumps.

5. The electronic package of claim 3, wherein the mesh structure and each of the plurality of conductive bumps are coplanar.

6. The electronic package of claim 3, wherein a width of each of the strips is greater than a maximum diameter of an end surface of each of the plurality of conductive bumps.

7. The electronic package of claim 1, wherein a width of each of the strips is at least 10 micrometers.

8. The electronic package of claim 1, wherein the mesh structure is a metal mesh.

9. The electronic package of claim 1, further comprising an encapsulation layer bonded to the circuit structure, wherein the electronic element is embedded in the encapsulation layer.

10. The electronic package of claim 1, further comprising an encapsulation layer formed between the electronic element and the circuit structure to cover the mesh structure.

11. A method of manufacturing an electronic package, comprising:
    providing a circuit structure, wherein the circuit structure is defined with a first side and a second side opposing the first side, and the circuit structure is provided with a conductive sheet and a circuit layer spaced apart from the conductive sheet on the first side of the circuit structure;
    disposing an electronic element having a plurality of electrode pads on the first side of the circuit structure, wherein at least one of the plurality of electrode pads is electrically connected to the circuit layer; and
    disposing a mesh structure between the electronic element and the first side of the circuit structure, wherein the mesh structure is electrically connected to the conductive sheet and at least the other one of the plurality of electrode pads, wherein the mesh structure has a plurality of interlaced strips to form a plurality of mesh holes corresponding to the plurality of electrode pads.

12. The method of claim 11, wherein at least one of the plurality of electrode pads is used as a signal contact, and at least the other one of the plurality of electrode pads is used as a power contact.

13. The method of claim 11, further comprising forming a plurality of conductive bumps on the plurality of electrode pads, wherein a part of the plurality of conductive bumps is electrically connected to the circuit layer, and another part of the plurality of conductive bumps is electrically connected to the conductive sheet.

14. The method of claim 13, further comprising providing the mesh structure and a protective layer on the electronic element, wherein the protective layer covers the mesh structure, the plurality of electrode pads and the plurality of conductive bumps.

15. The method of claim 13, wherein the mesh structure and each of the plurality of conductive bumps are coplanar.

16. The method of claim 13, wherein a width of each of the strips is greater than a maximum diameter of an end surface of each of the plurality of conductive bumps.

17. The method of claim 11, wherein a width of each of the strips is at least 10 micrometers.

18. The method of claim 11, wherein the mesh structure is a metal mesh.

19. The method of claim 11, further comprising:
    disposing the mesh structure on the electronic element;
    covering the electronic element and the mesh structure by an encapsulation layer, wherein the electronic element is embedded in the encapsulation layer; and
    forming the circuit structure on the encapsulation layer.

20. The method of claim 11, further comprising:
    disposing the mesh structure on the circuit structure;
    disposing the electronic element on the circuit structure and the mesh structure in a flip-chip manner; and
    forming an encapsulation layer between the electronic element and the circuit structure, wherein the encapsulation layer covers the mesh structure.

* * * * *